United States Patent [19]

Sanecki et al.

[11] Patent Number: 5,428,836
[45] Date of Patent: Jun. 27, 1995

[54] RADIO RECEIVER FOR FORMING A BASEBAND SIGNAL OF TIME-VARYING FREQUENCIES

[75] Inventors: Theodore T. Sanecki, Lyons; Paul J. Moller; Robert M. Johnson, Jr., both of Lake Zurich, all of Ill.

[73] Assignee: Motorola Inc., Schaumburg, Ill.

[21] Appl. No.: 137,377

[22] Filed: Oct. 14, 1993

Related U.S. Application Data

[63] Continuation of Ser. No. 823,483, Jan. 21, 1992, abandoned.

[51] Int. Cl.⁶ .............................................. H04B 1/16
[52] U.S. Cl. .................... 455/315; 455/209; 455/264
[58] Field of Search ............ 455/207, 209, 260, 264, 455/265, 259, 295, 296, 315–319

[56] References Cited

U.S. PATENT DOCUMENTS

| | | | |
|---|---|---|---|
| 4,551,856 | 11/1985 | Victor et al. | 455/316 X |
| 4,661,995 | 4/1987 | Kashiwagi | 455/315 |
| 4,709,407 | 11/1987 | Baba | 455/315 |
| 4,910,800 | 3/1990 | Chung | 455/209 |
| 5,003,621 | 3/1991 | Gailus | 455/209 |

*Primary Examiner*—Reinhard J. Eisenzopf
*Assistant Examiner*—Chi H. Pham
*Attorney, Agent, or Firm*—Dale B. Halling

[57] ABSTRACT

A radio receiver, and associated method therefor, for generating a baseband signal having signal component portions of time-varying frequencies. The oscillating signal generated by at least one of the local oscillators of down-mixing circuitry of the receiver is modulated by a low-frequency signal thereby to cause the resultant, baseband signal to be comprised of signal component portions of time-varying frequencies. Because the signal component portions of the baseband signal are of time-varying frequencies, attenuation of such signal component portions and resultant distortion of the received signal, as a result of undesirable notches in the frequency response of a radio receiver is avoided.

4 Claims, 5 Drawing Sheets

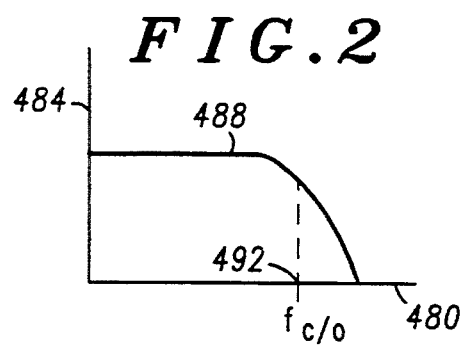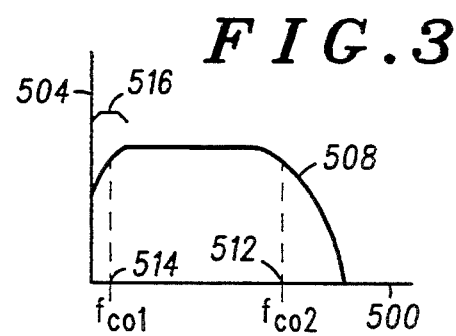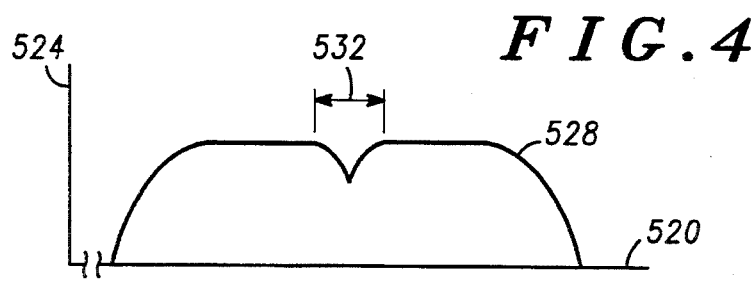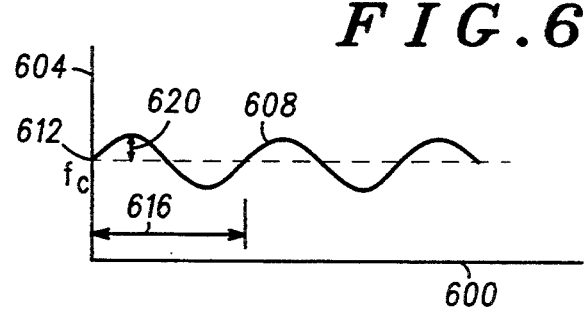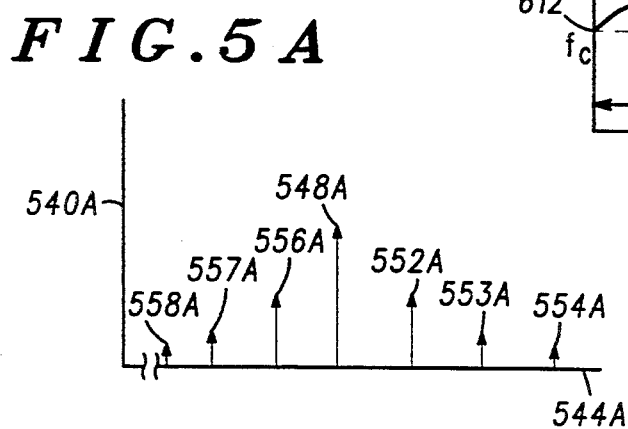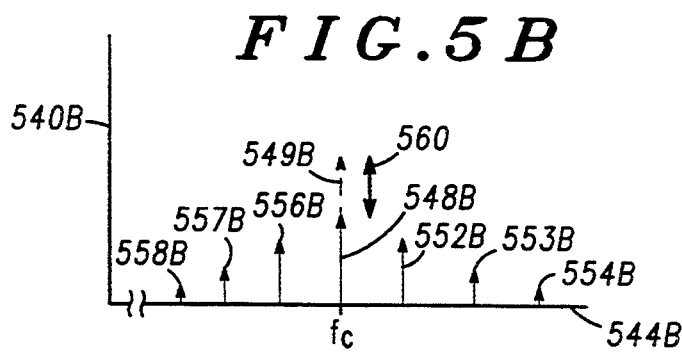

RADIO RECEIVER FOR FORMING A BASEBAND SIGNAL OF TIME-VARYING FREQUENCIES

This is a continuation of application Ser. No. 07/823,483, filed Jan. 21, 1992 and now abandoned.

BACKGROUND OF THE INVENTION

The present invention relates generally to radio receivers, and, more particularly, to a radio receiver using baseband filtering in place of conventional, bandpass intermediate frequency selectivity.

The design of conventional superheterodyne receivers is a known art; such receivers typically employ frequency-conversion and filtering circuitry to convert a desired radio frequency (RF) signal to one or more intermediate frequencies (IF) prior to demodulation of a signal received by such receivers.

To illustrate this technique, consider the following example of a receiver designed for the 843 to 870 megahertz (MHz) radio frequency band. This receiver may use a first intermediate frequency ("1st IF") of 55 MHz, and a second intermediate frequency ("2nd IF") of 460 kilohertz (kHz). Such a receiver would contain a bandpass filter to select signals in the 843–870 MHz range, and to reject signals outside such range; a mixer circuit (first mixer) to convert the desired radio frequency signal to a first intermediate frequency of fifty-five MHz; a bandpass filter centered at fifty-five MHz (the "1st IF filter") to select a relatively narrow band of frequencies about fifty-five MHz; and to reject signals outside such range; another mixer circuit (a "2nd mixer") to convert the filtered first intermediate frequency signal to the second intermediate frequency of 460 kHz; and bandpass filtering centered at 460 kHz to select a relatively narrow band of frequencies about 460 kHz, and to reject signals outside that range. The receiver would also contain radio frequency and intermediate frequency amplifiers, where needed, to assure adequate gain and noise figure. The first and second intermediate frequency filter bandwidths would be chosen such that the bandwidth would be appropriate for the type of modulation present on a signal received by the receiver. If the receiver were designed to receive a frequency-modulated signal, the filtered, second intermediate frequency signal would be applied to a limiter, and then to a frequency demodulator. The demodulated signal generated thereby would then be applied to audio processing circuitry (which performs functions such as deemphasis), amplified, and applied to a speaker. The receiver additionally contains local oscillators needed for the frequency conversion process. In this example, the first local oscillator would operate in the frequency range of 788 to 815 MHz, and would be applied to the first mixer; and the second local oscillator would operate at 54.540 MHz, and would be applied to the second mixer. In order to receive a signal at a particular radio frequency, the frequency of the first local oscillator must be set to the appropriate frequency. In this example, the first local oscillator is set to a frequency that is fifty-five MHz below the frequency of the desired radio frequency. Therefore, to receive 843.000 MHz, the first local oscillator is set to 788.000 MHz; to receive 843.100 MHz, the first local oscillator is set to 788.100 MHz; and so forth. The first local oscillator is typically a frequency synthesizer, in order to permit reception on frequency increments of 12.5 kHz in the 843 to 870 MHz band. The second local oscillator is on a fixed frequency, and may typically be a crystal oscillator or another frequency synthesizer.

The receiver in this example could be built using modern component technology. For example, the radio frequency bandpass filter could be constructed using dielectrically-loaded coaxial resonators; the first intermediate filter could be constructed using one or more monolithic crystal filters; the intermediate frequency amplifiers, mixers, limiter, demodulator, audio circuitry, and local oscillator circuits could be combined in one or more integrated circuits, or implemented with discrete components using surface-mount technology, or some combination of the two; and the second intermediate frequency filter could be implemented using one or more modular filters using ceramic resonators. Miniaturized receivers of this type have been constructed using the above technologies, and are characterized by small physical size, low weight, low cost and low power consumption.

Radio receivers have also been designed that use baseband filtering techniques in place of the filtering at the second intermediate frequency in conventional superheterodyne receivers. Such receivers eliminate the need for modular filters using ceramic resonators at the second intermediate frequency, and so make possible further reductions in receiver size and weight.

In a receiver that uses baseband filtering, the signal at the output of the first intermediate filter is down-converted to baseband frequencies by the second frequencies by the second mixer. The output of the second mixer is applied to a low pass filter; and the output of the low pass filter is then applied to a third mixer. The third mixer up-converts the filtered baseband signal to a third intermediate frequency, and this signal is, in turn, filtered, and applied to the appropriate demodulation and audio circuitry. (Further details of the baseband filtering process will be explained in connection with the description of the preferred embodiments of the present invention to be described hereinbelow.) The remainder of the receiver circuitry in a receiver using baseband filtering is much the same as it is for a conventional superheterodyne receiver.

The process of down conversion to baseband, low pass filtering, and up conversion ideally results in a circuit having a bandpass filter characteristic. The input frequency is centered at the first intermediate frequency, and the output frequency is centered at the third intermediate frequency.

Problems can arise, however, when the low pass filter is implemented as an active filter, as is the case when the second mixer, low pass filter, and third mixer are combined into an integrated circuit. The active filter used as the low pass filter consists of resistors, capacitors, and operational amplifiers. The operational amplifiers used may contain a DC offset at the output thereof, and this must be eliminated before the filtered baseband signal is applied to the third mixer. To block such DC components, blocking capacitors of appropriate value are used in the low pass filter to create an AC-coupled, low pass filter.

Typically, portions of the low pass filter circuitry also have associated resistive impedances in a shunt connection with respect to the series blocking capacitors. Such a resistive-capacitive combination has the characteristics of a high pass filter, which attenuates very low frequency components in the baseband signal. This is an undesired effect resulting from the removal of the DC component. Portions of the baseband signal can be attenuated by the high pass effect if sufficiently low in frequency. Furthermore, frequency components which are low in frequency in the baseband signal appear as frequency components near the center of the third intermediate frequency after up conversion. This combination down conversion, low pass filtering with an AC-coupled, low pass filter, and up conversion results in a circuit with a bandpass frequency response having a notch in the center, rather than the ideal bandpass characteristic. Significant distortion of the demodulated output signal results if significant baseband signal power is lost in the notch. For example, if an FM signal having a low modulation index passes through the circuit, and the carrier of the signal falls in the passband notch, then the output signal is highly distorted.

What is needed, therefore, is means for preventing significant attenuation of low frequency components in the baseband signal by the AC-coupled, low pass filter, and thereby avoiding significant distortion in the demodulated output signal, in a receiver using baseband filtering to achieve intermediate frequency selectivity.

SUMMARY OF THE INVENTION

The present invention, accordingly, advantageously provides means for preventing significant attenuation of low frequency components of a baseband signal by a receiver.

The present invention still further advantageously provides a method for altering the frequencies of a baseband signal by modulating the mixing signal applied to the mixer circuitry.

The present invention provides further advantages and features, the details of which will become more apparent by the reading the detailed description of the preferred embodiments hereinbelow.

In accordance with the present invention, therefore, a radio receiver for receiving a modulated, radio frequency signal having signal component portions of radio frequencies is disclosed. An electrical signal representative of the modulated, radio frequency signal is down-converted in frequency to form thereby a baseband signal having signal components of baseband frequencies. The baseband frequencies of the signal components of the baseband signals are altered to form thereby a baseband signal of time-varying frequencies, and the baseband signal of the time-varying frequencies is converted into a demodulated signal representative of the modulated, radio frequency signal received by the radio receiver.

BRIEF DESCRIPTION OF THE DRAWINGS

The present invention will be better understood when read in light of the accompanying drawings in which;

FIG. 2 is a graphical representation of the frequency response of a low pass filter;

FIG. 3 is a graphical representation, similar to that of FIG. 2, but illustrating the filter response of an AC-coupled, low pass filter;

FIG. 4 is a graphical representation of the frequency response of a portion of a receiver circuit including circuitry for down-converting a received signal received by the receiver to a baseband frequency, and low pass filtering through an AC-coupled, low pass filter and up-conversion circuitry for up-converting the baseband signal to an intermediate frequency;

FIG. 5A is a graphical representation of a frequency-modulated signal represented in the frequency domain;

FIG. 5B is a graphical representation of a frequency-modulated signal, in which the carrier of the signal has been attenuated, represented in the frequency domain;

FIG. 6 is a graphical representation of the instantaneous frequency of a signal generated by one of the local oscillators of a receiver of a preferred embodiment of the present invention;

DESCRIPTION OF THE PREFERRED EMBODIMENT

Figure 1:
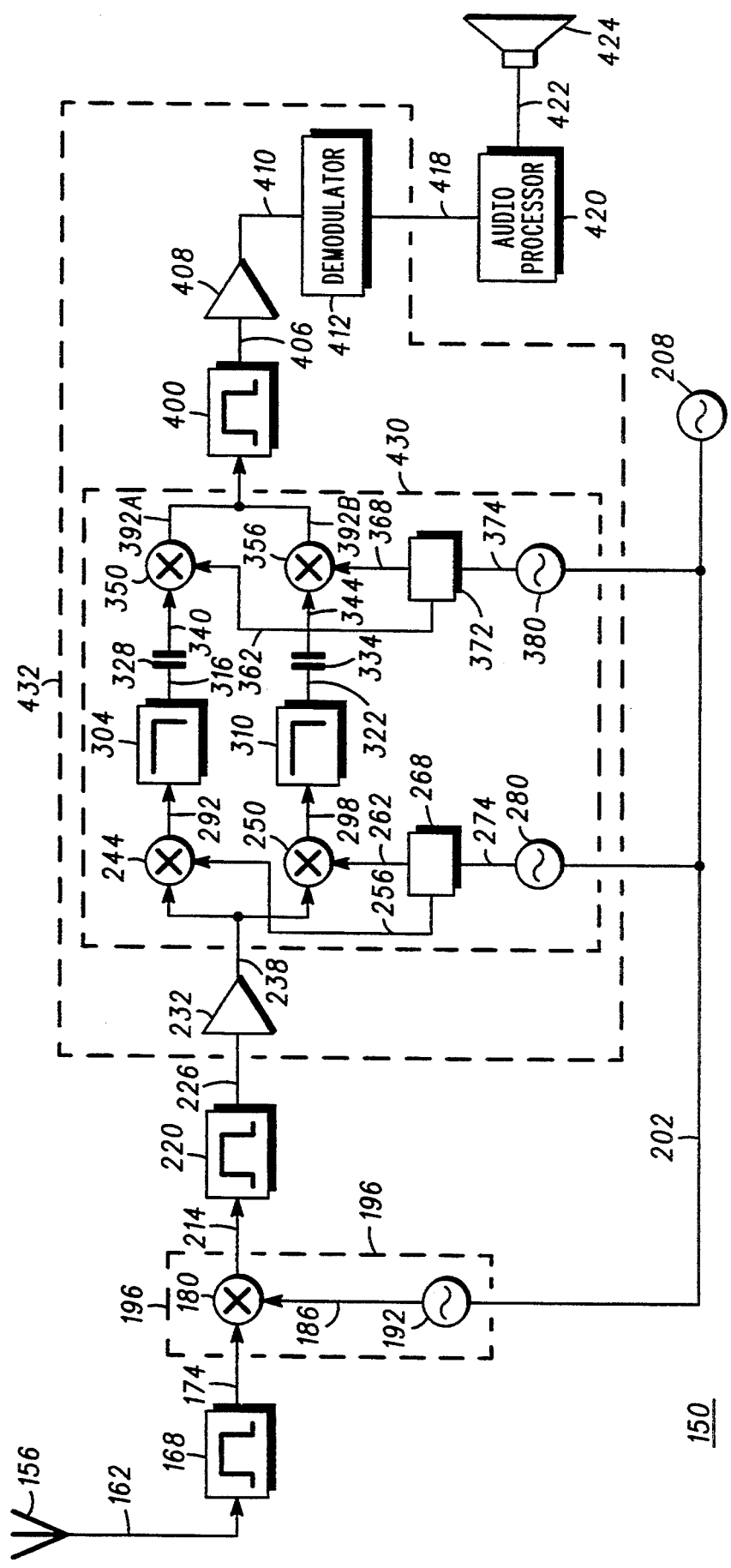
FIG. 1 is a block diagram of a radio receiver employing baseband filtering for intermediate frequency selectivity.

Turning first to the block diagram of FIG. 1, a baseband radio receiver, referred to generally by reference numeral 150, is shown. Radio receiver 150 is operative to down-convert in frequency a signal received by the receiver to a baseband frequency, and, thereafter, to up-convert the baseband signal and to apply the up-converted signal to demodulation circuitry.

A radio-frequency, electromagnetic signal is received by antenna 156 which converts the radio-frequency, electromagnetic signal into an electrical signal which is supplied on line 162 to radio frequency filter 168. (It is to be noted, of course, that a receiver need not include an antenna, such as antenna 156.) Radio frequency filter 168 is a bandpass filter, typically a filter using high-dielectric, ceramic material, which generates a filtered signal on line 174. The filtered signal comprised of signal portions of the electrical signal applied thereto on line 162 which are of frequencies within the passband of radio frequency filter 168.

The filtered signal generated on line 174 is applied to first down-mixer 180. Mixer 180 also receives an oscillating signal on line 186 generated by local oscillator 192. Oscillator 192 is typically referred to as the first local oscillator (or "1st LO"). Mixer 180, line 186 and local oscillator 192 together comprise a first down-mixing circuit. Local oscillator 192 is connected, by way of line 202, to reference oscillator 208. Such connection maintains the oscillating signal generated by local oscillator 192 in a known frequency relationship with a reference oscillating signal generated by reference oscillator 208.

First down-mixer 180 generates a down-mixed signal on line 214 which is applied to bandpass filter 220. The signal on line 214 is commonly referred to as the first intermediate frequency signal (or "1st IF"). When the radio-frequency, electromagnetic signal received by antenna 156 of receiver 150 is of a frequency bandwidth to be within the frequency band allocated for radiotelephone communications (e.g., between 843 and 870 megahertz), the oscillating signal generated by local oscillator 192 is of a frequency to cause first down-mixer 180 to generate a down-converted signal on line 214 which is centered at fifty-five megahertz. (When the signal received by antenna 156 is between 843 and 870 megahertz, the oscillating signal generated by local oscillator 192 is of a frequency between 788 and 815 megahertz.)

Bandpass filter 220 generates a filtered signal on line 226 which is applied to preamplifier 232. Preamplifier 232 generates an amplified signal on line 238 which is coupled to inputs of mixers 244 and 250. Mixers 244 and 250 also are supplied oscillating signals on lines 256 and 262, respectively, which are of similar frequencies, but in a ninety degree phase relation therebetween. Lines 256 and 262 are coupled to phase shifter 268 which receives an oscillating signal on line 274 generated by local oscillator 280. Local oscillator 280 is commonly referred to as the second local oscillator (or "2nd LO").

Local oscillator 280, similar to local oscillator 192, is coupled to receive the reference oscillation signal generated by reference oscillator 208. Such connection maintains the frequency of the oscillating signal generated by oscillator 280 in a known frequency relationship with the reference oscillation signal.

Mixers 244 and 250, lines 256 and 262, phase shifter 268, line 274, and oscillator 280 together form a second down-mixing circuit. This second down-mixing circuit is operative to convert downward in frequency signals applied thereto on line 238 to a baseband level.

When the signal generated on line 238 is of a frequency of 55 megahertz, the oscillating signal generated by local oscillator 280 is of a similar frequency to reduce the signal generated on line 238 to the baseband level.

Mixer 244 generates a baseband signal on line 292, and mixer 250 generates a baseband signal on line 298. Lines 292 and 298 are coupled to filters 304 and 310, respectively. Because the down-mixed signals generated on lines 292 and 298 are of baseband levels, filters 304 and 310 are comprised of low pass filters rather than bandpass filters. Low pass filters 304 and 310 are operative to pass, with minimal attenuation, frequency components of the baseband signal up to the low pass filter cutoff frequency, and then to reject frequency components of the baseband signal above the low pass filter cutoff frequency. Low pass filters may be advantageously formed using active filter techniques to permit such filters to be of small dimensions.

Filters 304 and 310 generate filtered signals on lines 316 and 322 which are coupled to blocking capacitors 328 and 334, respectively. Blocking capacitors 328 and 334 are operative to block the dc components of the baseband level signals filtered by filters 304 and 310.

Blocking capacitors 328 and 334 are coupled by way of lines 340 and 344 to mixers 350 and 356. Mixers 350 and 356 are also supplied with oscillating signals on lines 362 and 368, respectively. The oscillating signals generated on lines 362 and 368 are of similar frequencies, but are offset in phase by ninety degrees.

Lines 362 and 368 are coupled to phase shifter 372. Phase shifter 372 receives an oscillating signal on line 374 generated by local oscillator 380, and generates signals on lines 362 and 368 which are offset in phase from one another. Local oscillator 380 is commonly referred to as the third local oscillator (or "3rd LO"). Mixers 350 and 356, lines 362 and 368, phase shifter 372, line 374 and local oscillator 380 together comprise an up-mixing circuit.

Mixers 350 and 356 are operative to up-convert the baseband signals applied thereto to form the third intermediate frequency. For instance, local oscillator 380 may generate a third local oscillator signal of 131.25 kilohertz to convert the baseband level signals supplied to mixer 350 and 356 to frequencies centered at 131.25 kilohertz.

Mixers 350 and 356 generate up-converted signals on lines 392A and 392B, respectively, which are combined to form the third intermediate frequency. The third intermediate frequency is applied to filter 400. Filter 400 is a bandpass filter and generates a filtered signal on line 406 which is applied to limiter 408, and then, by way of line 410, to demodulator 412. Demodulator 412 generates a demodulated signal on line 418 which is supplied to audio processor 420. Audio processor 420 is operative to perform functions, such as, for example, audio filtering, deemphasis, and variable gain. Processor 420 generates a signal on line 422 which may be applied to a transducer, such as speaker 424.

Block 430, shown in hatch, is also illustrated in FIG. 1. The circuit elements contained in block 430 comprise the baseband filtering circuit in the receiver. Signals at the first intermediate frequency of fifty-five megahertz are converted to baseband, low pass filtered, and then up-converted to the third intermediate frequency of 131.25 kilohertz. Furthermore, block 430 has a bandpass frequency response with the bandwidth determined by the cutoff frequency of the low pass filters. This bandpass filter characteristic largely determines the overall bandwidth of the receiver, and also the selectivity thereof. Consequently, filters 304 and 310 are chosen to be multiple-section, low pass filters, to give a great deal of stopband rejection, and so enhance the overall ability of the receiver to reject undesired signals.

Block 432 is also shown in hatch in FIG. 1. The circuit elements in block 432 may be contained in an integrated circuit. If this were done, active filters could be used for filters 304, 310, and 400. Such active filters consist of resisters, capacitors and operational amplifiers. Filter 400 is a bandpass filter centered at 131.25 kilohertz. Such filter may be implemented as an active filter in the integrated circuit because the bandwidth is wider than the overall receiver bandwidth, and the selectivity requirements thereof are not great.

As can be seen from this description, receiver 150 shown in FIG. 1 achieves selectivity without the use of modular bandpass filters using ceramic ceramic resonators, as is typically done in conventional superheterodyne receivers.

Turning now to the graphical representation of FIG. 2, the frequency response of a low pass filter, such as low pass filter 304 or low pass filter 310 of radio receiver 150 of FIG. 1, taken in isolation. Abscissa axis 480 is scaled in terms of frequency, and ordinate axis 484 is scaled in terms of amplitude in decibels. Curve 488 is representative of the passband of an ideal low pass filter. When applied to such a filter, low frequency signal component portions of a signal are not attenuated. The filter has a cutoff frequency, $f_{co}$, designated by reference numeral 492. Signal component portions beyond the cut off frequency are attenuated. Accordingly, signal component portions of frequencies beyond the cut off frequency of such a low pass filter are attenuated, while signal component portions of a signal applied to such a low pass filter of frequencies less than the cut off frequency are passed by such a filter.

FIG. 3 is a graphical representation, similar to that of FIG. 2, but illustrating the actual frequency response of low pass filters 304 and 310 when forming a portion of the circuit of FIG. 1. Similar to the graphical representation of FIG. 2, the abscissa axis, here designated by reference numeral 500, is scaled in terms of frequency, and the ordinate axis, here axis 504, is scaled in terms of amplitude in decibels.

Curve 508 is actually the filter response of the combination of the low pass filter (either low pass filter 304 or low pass filter 310), and the series-connected, blocking capacitors 328 or 334 taken together with the shunt resistive component of mixers 340 or 356. As mentioned briefly hereinabove, the series-connected capacitive components, and the shunt-connected resistive components together form a high pass filter. Accordingly, the filter has both a high cutoff frequency, $f_{co2}$, designated by reference numeral 512, and a low cutoff frequency, $f_{co1}$, designated by reference numeral 514. The high pass filter formed of such a combination causes an attenuation-band at very low frequencies. Such area of attenuation is indicated in FIG. 3 by bracket 516, and is referred to as a "low frequency cutoff" of the filter characteristic. Signal component portions of the baseband signal of low frequency values are rejected as a result of the attenuation caused by the "low frequency cutoff" of the filter.

FIG. 4 is a graphical representation of the frequency response of an integrated circuit, designated in FIG. 1 by block 432, shown in hatch, which encompasses the elements encompassed by the block 430. Similar to the graphical representation of FIGS. 2-3, the abscissa axis, here axis 520, is scaled in terms of frequency, and the ordinate axis, here axis 524, is scaled in terms of amplitude in decibels. Curve 528 represents the frequency response of such an integrated circuit, and is formed of symmetrical left-hand and right-hand side portions. The right-hand side portion of curve 528 is similar to curve 508 of FIG. 3, and the left-hand side portion of curve 528 is similar to a mirror-image of curve 508 of FIG. 3. The rejection band indicated by bracket 516 of curve 508 of FIG. 3 also forms a portion of both the right-hand and left-hand side portions of curve 528. Together, these form a region of attenuation at the center of the frequency response of the integrated circuit. Such region of attenuation, referred to as an "IF hole", is defined by a band of frequencies indicated by line segment 532. The band of frequencies encompassed by line segment 532 is readily measurable by any of many conventional techniques. Signal component portions of a signal applied to such an integrated signal having frequencies of values within the range of frequencies defining the IF hole are attenuated. Such attenuation causes distortion of the signal applied to the demodulator, and, hence, distortion of the resultant demodulated signal appearing in a receiver such as receiver 150 of FIG. 1.

FIG. 5A is a graphical representation of a frequency modulated signal, represented in the frequency domain. The graphical representation is similar to the preceding figures, with abscissa axis 540A, scaled in amplitude in decibels (dB). The signal represented by FIG. 5A is a frequency modulated signal, with a sinusoidal modulating waveform, and with a low modulation index. The signal consists of a carrier at frequency $f_c$ designated by reference numeral 548A, and a number of sidebands, labelled 552A, 553A, 554A, and 556A, 557A, and 558A. (In FIG. 1, such a signal as shown in FIG. 5A would appear at lines 162, 174, or 214, and a slightly altered form would appear on lines 226 and 238.) According to FM theory, the frequency spacing of the sidebands is equal to frequency of the modulating waveform, and the amplitude and phases of the sidebands are in a certain relationship to the carrier, as determined by the modulation index. The amplitude and phase relationship between the carrier and the sidebands must be preserved, to a great degree, upon passing through the bandpass filters in a receiver, in order to assure a low distortion, demodulated signal. Therefore, the bandpass filters in a receiver are carefully designed with this in mind.

FIG. 5B is a graphical representation of a frequency modulated signal that has undergone significant attenuation of its carrier. FIG. 5B has abscissa and ordinate axes scaled in the same manner as the abscissa and ordinate axes of the graphical representation of FIG. 5A; also the amplitude of carrier 549B, shown in hatch, is the same as the amplitude of carrier 548A in FIG. 5A. In FIG. 5B, the amplitude of the carrier 548B has been attenuated by amount 560, from the unattenuated amplitude of 549B.

If the signal in FIG. 5B were applied to the demodulator, the resultant demodulated signal would be highly distorted because of the wrong amplitude relationship between the attenuated carrier 548B and sidebands 552B, 553B, 554B, 556B, 557B, and 558B.

FIG. 5B also illustrates the effect that the intermediate frequency hole has on a frequency modulated signal. When the signal shown in FIG. 5A is applied to a baseband filtering circuit (such as filter 430 of FIG. 1), the intermediate frequency hole causes significant attenuation of the carrier. Therefore, the signal applied to the demodulator is similar to that shown in FIG. 5B, and the demodulated output signal is highly distorted.

The preferred embodiments of the present invention advantageously utilize one or more frequency modulated local oscillators in a receiver such as receiver 150 of FIG. 1, a receiver which employs baseband filtering to achieve intermediate selectivity. Thus in FIG. 1, local oscillator 192 or local oscillator 280, or both, produce frequency modulated local oscillator signals on lines 186 and/or 274. By carefully selecting the waveform of the modulating signal, the frequency of the modulating signal, and the amount of frequency deviation, as applied to local oscillators 192 and/or 280, the resultant baseband signal varies in such a manner that signal components of the baseband signal do not regularly fall in the range of frequencies defining the intermediate frequency hole. This is done by making the frequency deviation of the frequency modulated local oscillator greater than the bandwidth of the intermediate frequency hole, as indicated by line 532 in FIG. 4. Again, because the band of frequencies encompassed by segment 532 is readily measurable, the frequency deviation required of the local oscillator is similarly readily determinable. The baseband signal that results varies with time and is positioned beyond the bandwidth of the intermediate frequency hole for significant time periods. This minimizes the loss of carrier, and subsequent distortion of the signal at the demodulator output.

FIG. 6 is a graphical representation of the instantaneous frequency of a frequency modulated signal, plotted as a function of time. The abscissa axis 600 is scaled in terms of seconds of time, and the ordinate axis 604 is scaled in terms of frequency. In FIG. 6, the instantaneous frequency is shown varying about a frequency $f_c$, with a sinusoidal waveform. The amount of frequency deviation is designated by line 620. And the amount of frequency deviation, designated by line 620, is readily determinable, responsive to the magnitude of the band of frequencies encompassed by line segment 532 of FIG. 4.

In the preferred embodiment of the present invention, the first local oscillator 192 in FIG. 1, or the second local oscillator 280 in FIG. 1, or both, are frequency modulated with a sinusoidal modulating waveform, and FIG. 6 represents the instantaneous frequency of the local oscillator signal.

Figure 7:
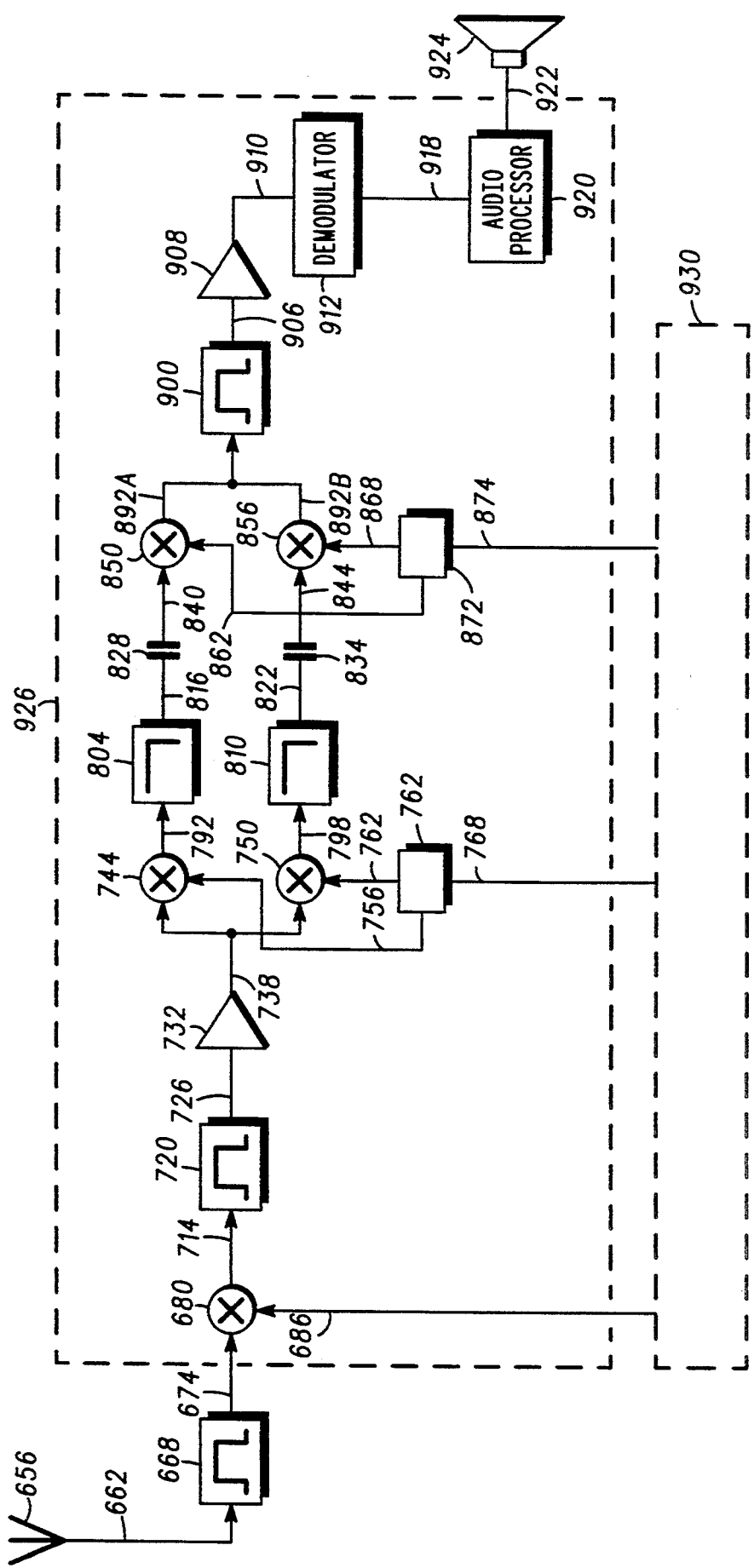
FIG. 7 is a block diagram of a radio receiver of a preferred embodiment of the present invention.

FIG. 7 is a block diagram of a radio receiver, referred to generally by reference numeral 650, constructed according to a preferred embodiment of the present invention. Radio receiver 650 of FIG. 7 is similar to radio receiver 150 of FIG. 1 in that receiver 650 is operative to down-convert in frequency a signal received by the receiver to a baseband frequency, and then to up-convert in frequency the baseband signal to apply thereafter the up-converted signal to demodulation circuitry.

Accordingly, a radio-frequency electromagnetic signal is received by antenna 656, and is converted into an electrical signal thereat and supplied on line 662 to bandpass filter 668. Bandpass filter 668 generates a filtered signal on line 674 which is applied to first down-mixer 680. Down-mixer 680 also is coupled to receive an oscillating signal on line 686 to down-convert in frequency the signal applied to mixer 680 on line 674.

Mixer 680 generates a first intermediate frequency signal (or "1st IF") on line 714 which is applied to bandpass filter 720. Filter 720 generates a filtered, first intermediate frequency signal on line 726 which is applied to preamplifier 732. Amplifier 732 generates an amplified signal on line 738 which is applied to mixers 744 and 750.

Mixers 744 and 750 are also coupled to receive oscillating signal on lines 756 and 762, respectively. The oscillating signals generated on lines 756 and 762 are similar in frequency, but are offset in phase from one another by a ninety degree phase differential. Lines 756 and 762 are coupled to phase shifter 768 which receives an oscillating signal on line 774.

Mixer 744 generates a baseband signal on line 792, and mixer 750 generates a baseband signal on line 798. Line 792 is coupled to low pass filter 804; similarly, line 798 is coupled to low pass filter 810. Filters 804 and 810 generate filtered signals on lines 816 and 822 which are coupled to blocking capacitors 828 and 834. Second sides of capacitors 828 and 834 are coupled, by way of lines 840 and 844, respectively, to up-conversion mixers 850 and 856. Mixers 850 and 856 are also coupled to receive, by way of lines 862 and 868, respectively, oscillating signals. The oscillating signals generated on lines 862 and 868 are similar in frequency, but are offset in phase by a ninety degree phase differential. Lines 862 and 868 coupled to phase shifter 872 which receives an oscillating signal on line 874.

Mixers 850 and 856 generate up-converted signals on lines 892A and 892B, respectively, which are combined theretogether to form the third intermediate frequency signal (or "3rd IF"). The third intermediate frequency signal is then applied to filter 900. Filter 900 generates a filtered signal on line 906 which is applied to limiter 908. Limiter 908 generates a limited signal on line 910 which is applied to demodulater 912. Demodulater 912 is operative to generate a demodulated signal on line 918 which is applied to audio processor 920. Audio processor generates a signal on line 922 which is applied to a transducer, such as speaker 924.

Block 926, shown in hatch, encompasses circuit elements designated by reference numerals 680–920, and is indicative of a portion of a receiver circuit referred to in FIG. 12 hereinbelow.

The local oscillator signals appear on lines 686, 768, and 874 of FIG. 7. In the preferred embodiment, line 686, or line 768, or both, supply frequency modulated local oscillator signals to mixers 680, 774, and 750. A low frequency, sinusoidal signal is used as a modulating waveform, and produces a frequency modulated signal with low deviation. The local oscillator circuitry and the frequency modulation circuitry is contained in block 930, shown in hatch.

A number of methods can be used to frequency-modulate the local oscillators in block 930. These methods comprise a number of preferred embodiments, and are illustrated in FIGS. 8, 9, 10, and 11.

Figure 8:
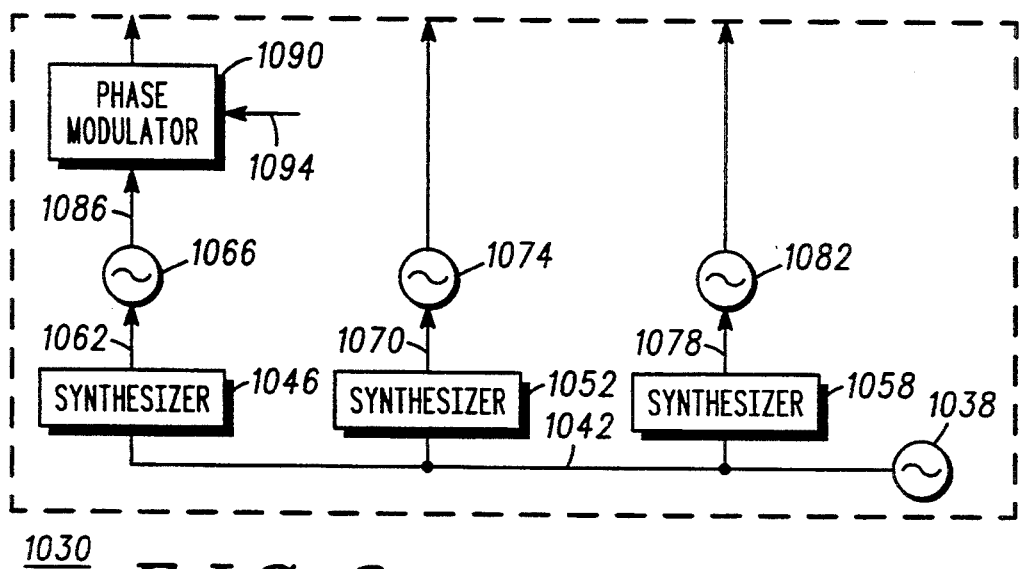
FIG. 8 is a block diagram of a portion of the receiver circuit of FIG. 7 constructed according to the teachings of the first embodiment of the present invention.

Turning now to the block diagram of FIG. 8, a first preferred embodiment of the circuitry comprising the circuit encompassed by block 930 of FIG. 7 is illustrated. The circuit, referred to generally by reference numeral 1030, is operative to modulate the oscillating signal generated on line 686, and applied to mixer 680 of radio receiver 650 of FIG. 7.

Reference oscillator 1038 of circuit 1030 of FIG. 8 generates a reference oscillation signal on line 1042 which is applied to first LO synthesizer 1046, second LO synthesizer 1052, and third LO synthesizer 1058. Synthesizers 1046–1058 comprise portions of conventional phase-locked loop circuits.

First LO synthesizer 1046 is appropriately coupled, here by line 1062 to LO oscillator 1066. Similarly, synthesizer 1052 is appropriately coupled by way of line 1070 to LO oscillator 1074, and synthesizer 1058 is appropriately coupled by way of line 1078 to local oscillator 1082.

While local oscillators 1074 and 1082 generate oscillating signals which are coupled to lines 768 and 874, respectively, of radio receiver 650 of FIG. 7, the oscillating signal generated by local oscillator 1066 is first applied, by way of line 1086 to phase modulator 1090. The modulating signal is applied to phase modulator on line 1094 to phase modulate the oscillating signal applied thereto on line 1086. The phase modulated, oscillating signal formed by phase modulator 1090 is applied on line 686 to mixer 680 of the radio receiver 650 of FIG. 7. Because the down-mixing signal applied to mixer 680 is phased-modulated, the baseband signal formed during operation of radio receiver 650 is time-varying.

Figure 9:
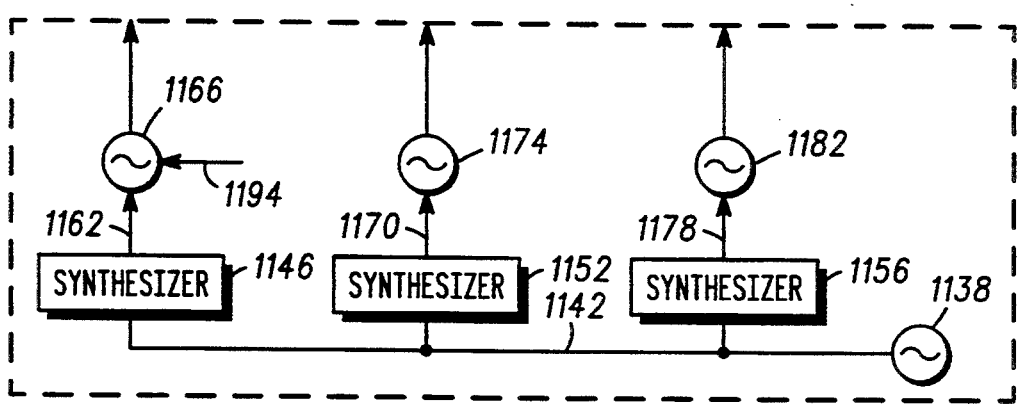
FIG. 9 is a block diagram, similar to that of FIG. 8, but illustrating a portion of a receiver circuit of FIG. 7 constructed according to the teachings of an alternate embodiment of the present invention.

FIG. 9 is a block diagram of a second preferred embodiment of the circuitry comprising the circuit enclosed by block 930 of FIG. 7. The circuit, referred to generally by reference numeral 1130, is also operative to modulate the oscillating signal which is applied on line 686 of FIG. 7 to mixer 680. Similar to circuit 1030 of FIG. 8, circuit 1130 of FIG. 9 comprises a reference oscillator, here designated by reference numeral 1138, which generates a reference oscillation signal on line 1142. Line 1142 is coupled to first LO synthesizer 1146, second LO synthesizer 1152, and third LO synthesizer 1156. Again, synthesizers 1146–1156 are preferably comprised of conventional, phase-locked loop circuits.

Synthesizer 1146 is appropriately coupled, by way of line 1162 to oscillator 1166. Similarly, synthesizer 1152 is appropriately coupled, by way of line 1170, to oscillator 1174, and synthesizer 1156 is appropriately coupled, by way of line 1178, to oscillator 1182.

While oscillators 1174 and 1182 generator oscillating signals which are supplied on lines 774 and 874 of radio receiver 650 of FIG. 7, oscillator 1166 is first modulated by a modulating signal applied thereto on line 1194. Accordingly, the oscillating signal generated by oscillator 1166 is a frequency-modulated, mixing signal which may be applied by way of line 686 of receiver 650 of FIG. 7 to mixer 680. Because the mixing signal applied to mixer 680 is of a time-varying frequency, the resultant, baseband signal generated by radio receiver 650 during operation thereof is similarly time-varying.

Figure 10:
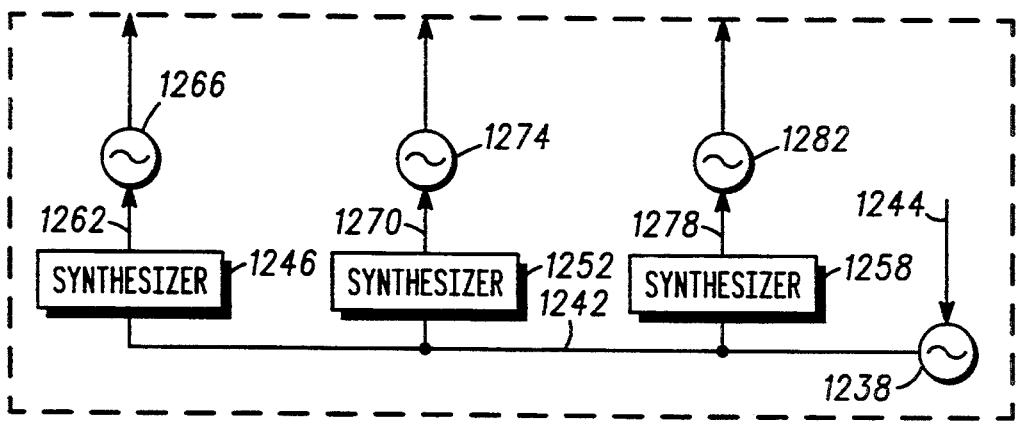
FIG. 10 is a block diagram similar to those of FIGS. 8–9, but illustrating a portion of the receiver circuit of FIG. 7 constructed according to the teachings of another alternate embodiment of the present invention.

FIG. 10 is a block diagram of a third preferred embodiment of the circuitry comprising the circuit enclosed by block 930 of FIG. 7. The circuit, referred to generally by reference numeral 1230 is again operative to apply a modulated, mixing signal to at least one of the mixers to cause the signal component portions of the baseband signal generated by the receiver 650 to be of time-varying frequencies. Again, similar to the embodiments of FIGS. 8–9, circuitry 1230 includes a reference oscillator, here designated by reference numeral 1238, which generates a reference oscillation signal on line 1242. In this embodiment, however, the reference oscillation signal generated on line 1242 is not a steady-state oscillating signal, but rather is a frequency-modulated signal as a modulating signal is applied to reference oscillator 1238 on line 1244. The modulating signal generated on line 1244 is similar to the modulated signal described with respect to the graphical representation of FIG. 6. Line 1242 is coupled to first low synthesizer 1246, second low synthesizer 1252, and third low synthesizer 1258. Again, synthesizers 1246–1258 are preferably comprised of conventional, phase-locked loop circuits. Synthesizer 1246 is appropriately coupled, hereby way of line 1262, to oscillator 1266. Similarly, synthesizer 1252 is coupled, by way of line 1270, to oscillator 1274, and synthesizer 1258 is appropriately coupled, here by way of line 1278 to local oscillator 1282.

Oscillators 1266, 1274, and 1282 each generate oscillating signals to be applied to lines 686, 774, and 874, respectively, of receiver 650 of FIG. 7.

The baseband signal is of time varying frequencies. Frequency modulation appears on all three local oscillators 1266, 1274, and 1282. Local oscillator 1266 has the largest deviation since oscillator 1266 operates at the highest operating frequency; local oscillator 1282 has the lowest deviation since oscillator 1282 operates at the lowest operating frequency. Even though all three oscillators have frequency modulation, the baseband signal is still time varying because of the predominance of the deviation on local oscillator 1266.

As the reference oscillation signal is a frequency modulated signal, each of the signals generated by oscillators 1266–1282 is similarly a frequency modulated signal.

Figure 11:
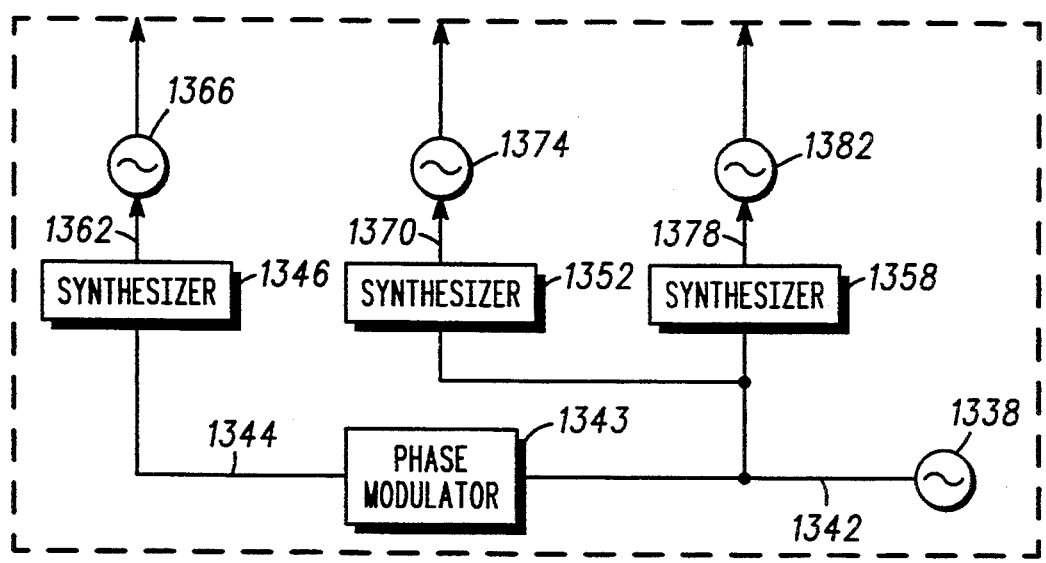
FIG. 11 is another block diagram, similar to those of FIGS. 8–10, but illustrating a portion of the receiver of FIG. 7 constructed according to the teachings of yet another alternate embodiment of the present invention.

FIG. 11 is a block diagram of another preferred embodiment of the circuitry comprising the circuit enclosed by block 930 of FIG. 7. The circuit, indicated generally by reference numeral 1330, again includes a reference oscillator, here designated by reference numeral 1338. Reference oscillator 1338 generates a reference oscillation signal on line 1342. Line 1342 is coupled to phase modulator 1343 which is operative to phase modulate the reference oscillation signal applied thereto, and to generate a modulated, reference oscillation signal on line 1344. Line 1344 is coupled to first LO synthesizer 1346. Second LO synthesizer 1352 is coupled to receive the reference oscillation signal generated on line 1342; similarly, third LO synthesizer 1358 is coupled to receive the reference oscillation signal generated by reference oscillator 1338 on line 1342. Again, synthesizers 1346–1358 are preferably formed of conventional, phase-locked loop circuits.

Synthesizer 1346 is appropriately coupled, here by way of line 1362, to synthesizer 1366. Similarly, synthesizer 1352 is appropriately coupled, here by way of line 1370, to local oscillator 1374, and synthesizer 1358 is appropriately coupled, here by way of line 1378, to oscillator 1382. Oscillators 1366–1382 generate oscillating signals which may be applied directly to lines 686, 774, and 874 of radio receiver 680.

Because the signal generated on line 1344 and applied to synthesizer 1346 is phase-modulated, the signal component portions of the resultant, baseband signal generated by radio receiver 650 is comprised of time-varying frequencies.

Figure 12:
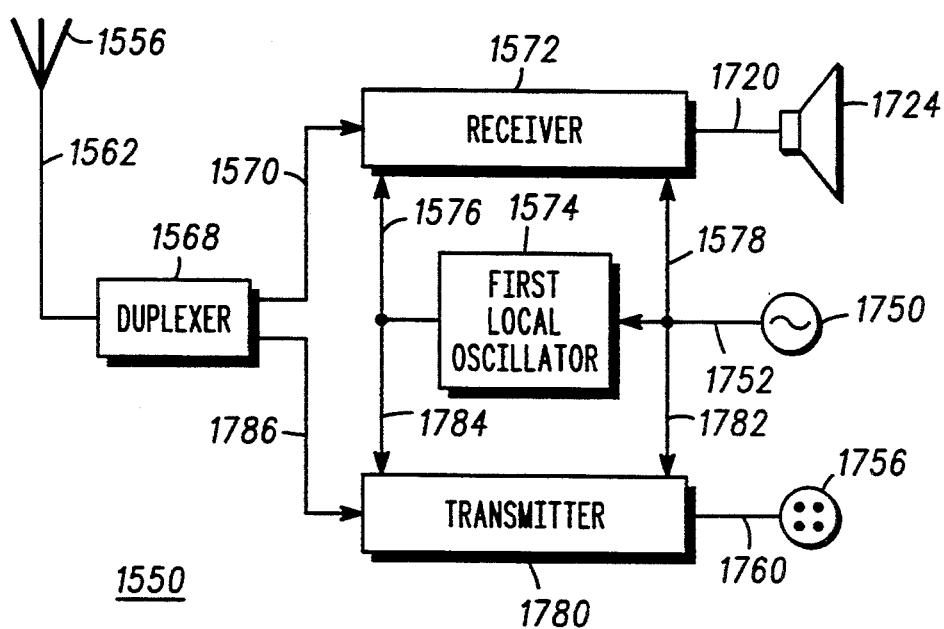
FIG. 12 is a block diagram of a radiotelephone incorporating the receiver circuitry of a preferred embodiment of the present invention.

Finally, turning now to the block diagram of FIG. 12, a transceiver, such as the transceiver portion of a radiotelephone, and referred to generally by reference numeral 1550 is shown. The receiver portion of transceiver 1550 incorporates circuitry similar to that of receiver 650 of FIG. 7. Furthermore, transceiver 1550 incorporates local oscillator circuitry similar to the preferred embodiment shown in FIG. 10. Accordingly, antenna 1556 is coupled by line 1562 to duplexer 1568. Signals in the receive frequency band are coupled by line 1570 to the input of receiver 1572. Receiver 1572 is a receiver using baseband filtering in place of conventional IF selectivity, and is comprised of block 926 shown in FIG. 7 and blocks 1252, 1274, 1258, and 1282 of FIG. 10. The output of receiver 1572 is coupled by way of line 1720 to speaker 1724. Block 1574 is the first local oscillator, and supplies a first local oscillator signal to receiver 1572 by way of line 1576; block 1574 of FIG. 12 corresponds to blocks 1246 and 1266 of FIG. 10. Reference oscillator 1750 supplies a reference oscillator signal to receiver 1572, and first local oscillator 1574.

The transmitter portion of transceiver 1550 is comprised of microphone 1756 which generates an electrical signal on line 1760 to transmitter 1780. The first local oscillator signal generated by local oscillator 1574 is applied to the transmitter 1780 by way of line 1784. The reference oscillator signal generated by reference oscillator 1750 is applied to transmitter 1780 by way of line 1782. Transmitter 1780 contains all of the necessary circuitry to generate an appropriate transmit signal on line 1786, which is coupled to duplexer 1568, and finally to antenna 1556 by way of line 1562.

Reference oscillator 1750 has a frequency-modulating waveform applied to it by way of line 1754, in accordance with the preferred embodiment shown in FIG. 10.

Because the baseband signal generated during downconversion of a signal received by the radio receiver (or radio receiver portion of a radio transceiver) of the present invention is comprised of signal component portions of time-varying frequencies, undesirable attenuation and resultant signal distortion of a signal received by the receiver is avoided.

While the present invention has been described in connection with the preferred embodiments shown in the various figures, it is to be understood that other similar embodiments may be used and modifications and additions may be made to the described embodiments for performing the same function of the present invention without deviating therefrom. Therefore, the present invention should not be limited to any single embodiment, but rather construed in breadth and scope in accordance with the recitation of the appended claims.

What is claimed is:

1. A radio receiver for receiving a modulated, radio frequency signal having signal component portions of radio frequencies, said radio receiver comprising:

means for down-converting in frequency an electrical signal representative of the modulated, radio frequency signal received by the radio receiver, said means for down-converting having at least one down-mixing circuit including a reference oscillator for generating a reference oscillation signal and at least one local oscillator coupled to receive a signal representative of the reference oscillation signal, the at least one local oscillator for generating at least one mixing signal for down-mixing the electrical signal representative of the modulated, radio frequency signal such that the at least one down-mixing circuit forms thereby a first baseband signal having signal components of baseband frequencies;

means for altering the baseband frequencies of the signal components of the first baseband signal formed by said means for down-converting, said means for altering comprising a phase modulator coupled to receive the mixing signal generated by the at least one local oscillator and also to receive a modulating signal, wherein the phase modulator is operative to phase modulate the mixing signal which, in turn, is utilized to down-mix the electrical signal representative of the modulated, radio frequency signal and, in turn, convert thereby the first baseband signal into a time-varying baseband signal of time-varying frequencies; and means for converting the baseband signal of time varying frequencies into a demodulated signal representative of the modulated, radio frequency signal received by the radio receiver.

2. In A radio receiver, a method for forming a baseband signal of time-varying frequencies responsive to reception of a modulated, radio frequency signal, said method comprising the steps of:

down-converting in frequency an electrical signal representative of the modulated, radio frequency signal received by the radio receiver by down-mixing the electrical signal with at least one mixing signal generated by at least one down-mixing circuit which is maintained in a frequency relationship with a reference oscillation signal generated by a reference oscillator to form thereby a first baseband signal having signal components of baseband frequencies; and altering the baseband frequencies of the signal components of the first baseband signal formed during said step of down-converting by phase modulating the at least one mixing signal to form thereby a time-varying baseband signal of time varying frequencies.

3. A radio receiver for receiving a modulated, radio frequency signal having signal component portions of radio frequencies, said radio receiver comprising:

means for down-converting in frequency an electrical signal representative of the modulated, radio frequency signal received by the radio receiver, said means for down-converting having at least one down-mixing circuit including a reference oscillator for generating a reference oscillation signal and at least one local oscillator coupled to receive a signal representative of the reference oscillation signal, the at least one local oscillator for generating a mixing signal for down-mixing the electrical signal representative of the modulated, radio frequency signal such that the at least one down-mixing circuit forms thereby a first baseband signal having signal components of baseband frequencies;

means for altering the baseband frequencies of the signal components of the first baseband signal formed by said means for down-converting, said means for altering modulating the mixing signal by a phase modulator for phase modulating the reference oscillation signal generated by the reference oscillator and, in turn, to convert thereby the first baseband signal into a time-varying baseband signal of time-varying frequencies; and means for converting the time-varying baseband signal of time varying frequencies into a demodulated signal representative of the modulated, radio frequency signal received by the radio receiver.

4. A radio receiver for receiving a modulated, radio frequency signal having signal component portions of radio frequencies, said radio receiver comprising:

means for down-converting in frequency an electrical signal representative of the modulated, radio frequency signal received by the radio receiver, said means for down-converting comprising;

a first down-mixing circuit and a second down-mixing circuit having a first mixing signal and a second mixing signal, said first down-mixing circuit operative to mix the electrical signal representative of the modulated, radio frequency signal with the first mixing signal to form a first down-mixed signal, and said second down-mixing circuit operative to mix the first down-mixed signal with second mixing signal to form a baseband signal thereby;

a reference oscillator for generating a reference oscillation signal and a first and a second local oscillator coupled to receive a signal representative of the reference oscillation signal, the first local oscillator generating the first mixing signal and the second local oscillator generating the second mixing signal for down-mixing the electrical signal representative of the modulated, radio frequency signal;

means for altering the baseband frequencies of the signal components of the first baseband signal formed by said means for down-converting by phase modulating the reference oscillation signal generated by the reference oscillator, said means for altering, modulating the first and second mixing signals generated by the first and second local oscillators which modulate the reference oscillation signal generated by the reference oscillator and, in turn, to convert thereby the baseband signal into a time-varying baseband signal of time-varying frequencies; and means for converting the time-varying baseband signal of time varying frequencies into a demodulated signal representative of the modulated, radio frequency signal received by the radio receiver.

* * * * *